(12) United States Patent
Larson

(10) Patent No.: US 7,669,027 B2
(45) Date of Patent: Feb. 23, 2010

(54) MEMORY COMMAND DELAY BALANCING IN A DAISY-CHAINED MEMORY TOPOLOGY

(75) Inventor: Douglas Alan Larson, Lakeville, MN (US)

(73) Assignee: Micron Technology, Inc., Boise, ID (US)

( * ) Notice: Subject to any disclaimer, the term of this patent is extended or adjusted under 35 U.S.C. 154(b) by 287 days.

(21) Appl. No.: 10/922,299

(22) Filed: Aug. 19, 2004

(65) Prior Publication Data

US 2006/0041730 A1   Feb. 23, 2006

(51) Int. Cl.
*G06F 12/00* (2006.01)
(52) U.S. Cl. .................................................. 711/167
(58) Field of Classification Search ............... 711/167
See application file for complete search history.

(56) References Cited

U.S. PATENT DOCUMENTS

| | | | | |
|---|---|---|---|---|
| 4,860,375 A | * | 8/1989 | McCubbrey et al. | 382/303 |
| 5,043,883 A | * | 8/1991 | Inouchi et al. | 711/169 |
| 5,892,981 A | | 4/1999 | Wiggers | |
| 5,966,731 A | | 10/1999 | Barth et al. | |
| 6,154,821 A | * | 11/2000 | Barth et al. | 711/170 |
| 6,173,345 B1 | | 1/2001 | Stevens | |
| 6,502,161 B1 | * | 12/2002 | Perego et al. | 711/5 |
| 6,658,523 B2 | * | 12/2003 | Janzen et al. | 711/105 |
| 2003/0041224 A1 | | 2/2003 | Toda | |
| 2004/0153857 A1 | * | 8/2004 | Yamazaki et al. | 714/43 |

FOREIGN PATENT DOCUMENTS

WO   WO 99/19876   4/1999

* cited by examiner

*Primary Examiner*—Reginald G Bragdon
*Assistant Examiner*—Aracelis Ruiz
(74) *Attorney, Agent, or Firm*—Jones Day; Edward L. Pencoske; Matthew W. Johnson

(57) ABSTRACT

A methodology for a daisy-chained memory topology wherein, in addition to the prediction of the timing of receipt of a response from a memory module (DIMM), the memory controller can effectively predict when a command sent by it will be executed by the addressee DIMM. By programming DIMM-specific command delay in the DIMM's command delay unit, the command delay balancing methodology according to the present disclosure "normalizes" or "synchronizes" the execution of the command signal across all DIMMs in the memory channel. With such ability to predict command execution timing, the memory controller can efficiently control power profile of all the DRAM devices (or memory modules) on a daisy-chained memory channel. A separate DIMM-specific response delay unit in the DIMM may also be programmed to provide DIMM-specific delay compensation in the response path, further allowing the memory controller to accurately ascertain the timing of receipt of a response thereat, and, hence, to better manage further processing of the response.

30 Claims, 3 Drawing Sheets

MEMORY COMMAND DELAY BALANCING IN A DAISY-CHAINED MEMORY TOPOLOGY

BACKGROUND

1. Field of the Disclosure

The present disclosure generally relates to memory systems and, more particularly, to command delay balancing in daisy-chained memory devices.

2. Brief Description of Related Art

Memory devices are widely used in many electronic products and computers to store data. A memory device is a semiconductor electronic device that includes a number of memory chips, each chip storing a portion of the total data. The chips themselves contain a large number of memory cells, with each cell storing a bit of data. The memory chips may be part of a DIMM (dual in-line memory module) or a PCB (printed circuit board) containing many such memory chips. In the discussion hereinbelow, the terms "memory device", "memory module" and "DIMM" are used synonymously. A processor or memory controller may communicate with the memory devices in the system to perform memory read/write and testing operations. FIG. 1 illustrates a prior art arrangement 10 showing signal communication between a memory controller 11 and a plurality of memory devices (DIMMs) 12, 18, and 24, over a parallel memory bus 30 (also known as a "stub bus"). For ease of discussion and illustration, only three memory devices (DIMM0(12), DIMM1(18), and DIMM N1(24)) are shown in FIG. 1 out of a total of N memory devices, which are controlled by and communicating with the memory controller 11. It is observed that also for ease of discussion each DIMM in FIG. 1 is shown to contain the same N number of DRAM (Dynamic Random Access Memory) memory chips. For example, memory module 12 contains a DRAM memory bank 14 having an N number of DRAM chips 16, whereas memory module 18 contains a memory bank 20 having an N number of DRAM chips 22, and so on. However, it is evident that each DIMM in FIG. 1 may contain a different number of memory chips or DRAMs. It is noted here that the terms "DRAM chip," "memory chip", "data storage and retrieval element," and "memory element" are used synonymously hereinbelow.

Each memory chip 16, 22, 28 may include a plurality of pins (not shown) located outside of the chip for electrically connecting the chip to other system devices through the DIMM on which the chip resides. Some of those pins (not shown) may constitute memory address pins or address bus, data pins or data bus, and control pins or control bus. Additional constructional details of a memory chip (e.g., one of the chips 16) are not relevant here and, hence, are not presented. Those of ordinary skill in the art will readily recognize that memory chips 16, 22, and 28 of FIG. 1 are not intended to be a detailed illustration of all of the features of a typical memory chip. Numerous peripheral devices or circuits (not shown) may be typically provided on a DIMM along with the corresponding memory chips for writing data to and reading data from the memory cells (not shown) in the chips. Furthermore, constructional details of a DIMM (e.g., the DIMMs 12, 18, and 24) in FIG. 1 are also not shown for ease of illustration only. In reality, each DIMM may be connected to the parallel bus 30 via appropriate DIMM connectors (not shown) to allow signal flow between the DIMM and the controller 11.

In the parallel bus implementation 10 of FIG. 1, the memory controller 11 sends address and/or control signals over the address/control bus portion (not shown) of the parallel bus 30 and transfers data to/from the DIMMs over the data bus portion (not shown) of the parallel bus 30. The parallel bus 30 is a signal transfer bus that includes address and control lines (both of which are unidirectional) as well as data lines (which are bi-directional)—some or all of which are connected to each DIMM in the system and are used to perform memory data transfer operations (i.e., data transmission and reception operations) between the memory controller 11 and respective DIMMs 12, 18, 24. The memory controller 11 may determine the modes of operation of a memory module (or DIMM). Some of the control signals (not shown) from the memory controller 11 may include a chip select (CS_N) signal, a row address select (RAS_N) signal, a column address select (CAS_N) signal, a Write Enable (WE_N) signal, row/column address (A), a Data Mask (DM) signal, a termination control (ODT_N) signal, and a set of single-ended or differential data strobes (RDQS/RDQS#/DQS/DQS#), etc. These control signals are transmitted on the control lines or control bus (not shown) portion of the parallel bus 30 to perform data transfer operations at selected memory cells in the appropriate memory chips (DRAMs). The "width" (i.e., number of lines) of address, data and control buses may differ from one memory configuration to another.

It is observed that in the parallel bus configuration 10 of FIG. 1, each memory module 12, 18, 24 is directly connected to the memory controller 11 via the parallel bus 30. In other words, the memory controller 11 is connected to each memory module (DIMM) in parallel. Thus, every signal output from the controller 11 reaches each memory module in parallel. While such an arrangement may be easier to implement and may provide a "wider" memory bus, a penalty to be paid is the limited speed with which signaling can be carried out on the bus 30. In modern implementations of the parallel bus 30, the signaling speed caps at about 800 MHz. Further, in the parallel bus configuration, any delay encountered in the slowest DIMM governs the overall delay in data transfer operations. To increase the signaling speed of memory data transfer operations in the GHz region to avail of the processing power of modern faster memory chips and controllers, the parallel bus configuration may not be suitable.

FIG. 2 illustrates an alternative configuration 32 where memory modules (DIMMs) 34, 40, and 44 are connected to a memory controller 33 in a daisy-chained configuration. As before, only three of the memory modules (out of a total of N modules) are illustrated in FIG. 2 for the sake of simplicity. Also for the sake of clarity, in FIG. 2, a connector for a memory module (the DIMM connector) is identified with the same reference numeral as that of the corresponding memory module. Similar to the embodiment of FIG. 2, each DIMM in FIG. 2 contains a corresponding DRAM memory bank with a plurality of memory chips or DRAM chips therein. For example, DIMM0(34) is shown to contain a memory bank 36 with N DRAM chips 38. For the sake of clarity, other memory banks (e.g., memory banks 42 and 46) in FIG. 2 are not shown with corresponding memory chips.

In the daisy-chained configuration 32 of FIG. 2, each DIMM connector 34, 40, 44 has a pair of "downlink" terminals and a pair of "uplink" terminals. Each pair of downlink terminals includes a downlink-in terminal (DL_In) and a downlink-out terminal (DL_Out). Similarly, each pair of uplink terminals includes an uplink-in terminal (UL_In) and an uplink-out terminal (UL_Out). The daisy-chained configuration 32 is a serial signal transfer mechanism as opposed to the parallel mechanism shown in FIG. 1. Thus, a memory module receives a signal from the memory controller 33 on the downlink channel (comprising of all the downlink terminals 48A-48C in the configuration 32), whereas a signal to the memory controller 33 is transmitted on the uplink channel (which includes all the uplink terminals 50A-50C in the configuration 32). Signals are serially propagated from one memory module to another via signal "hops." Thus, for example, a command broadcast to all of the DIMMs 34, 40, 44 from the memory controller 33 is first received at the DL_In terminal 48A of DIMM0(34), which, in turn, forwards that command to DIMM1(40) via its DL_Out terminal 48B that is also connected to the DL_In terminal of DIMM 40. This completes one command "hop". After a second command "hop", the command from the memory controller 33 appears at DL_Out terminal 48C of the memory module 40. Thus, with a total of N−1 "hops", the command will reach the last or farthest DIMM (here, DIMM 44) in the memory channel (which consists of all memory modules connected to the memory controller 33 in the daisy-chained configuration 32). Similarly, an N−1 "hops" may be needed for a response to the command from the last or farthest DIMM 44 to reach the memory controller 33. It is noted here that the term "command" is used herein to refer to address, data, and/or control signals transmitted from the memory controller 33 (e.g., during a data write operation, or during a memory module testing operation) to one or more DIMMs in the system 32. On the other hand, the term "response" is used herein to refer to a data or a status signal (e.g., during a data read operation, or during a memory test operation) sent to the memory controller 33 and generated by a DIMM in response to the command received from the memory controller 33.

As is seen from FIG. 2, in a daisy-chained memory configuration, the memory controller 33 is directly connected to only one of the DIMM modules (i.e., the memory module 34 in FIG. 2) as opposed to all of the memory modules as in the parallel bus configuration of FIG. 1. Thus, one disadvantage of the serial daisy-chaining is that a defect or malfunction at one of the memory modules may prevent further "downstream" propagation of the command from the memory controller 33. However, despite this disadvantage, the daisy-chained configuration 32 offers significant benefits including, for example, very high speed signal propagation (in the range of multi-GHz) and more control over individual DIMM's data transfer operations. Thus, the signaling in the daisy-chained configuration 32 can be significantly faster than that in the parallel configuration 10. As noted before, each DIMM in the daisy-chained configuration acts as a "repeater" of the signal for the next DIMM-downstream (connected to the DL_Out terminal) or upstream (connected to the UL_Out terminal). The downlink and uplink channels are extremely fast, narrow-width, unidirectional (one-way) signal buses that carry encoded signal packets (containing memory address, data, and/or control information from the memory controller 33) which are decoded by the receiver DIMM. The downlink channel carries signal in one direction, whereas the uplink channel carries a different signal in the opposite direction. It is evident that in the daisy-chained configuration 32 of FIG. 2, a signal must travel through "hops" whether it is a signal broadcast from the memory controller 33 to all of the DIMMs in the memory channel, or whether it is a signal addressed to only a single DIMM in the memory channel. That is, any signal from the memory controller 33 propagates to the desired/destination DIMM(s) via one or more hops involving one or more intervening DIMMs.

It is noted here that the term "daisy-chained configuration" is used herein to refer to a high-speed, serial bus configuration and, more particularly, to a serial bus configuration linking a plurality of electronic devices (e.g., memory modules 34, 40, 44 in FIG. 2) with a controller thereof (e.g., the memory controller 33 in FIG. 2) using unidirectional signal transfer links, where the set of links or terminals (the downlinks) carrying signals out of the controller is different from the set of links (the uplinks) that carries the signals to the controller.

From the foregoing discussion, it is seen that in the daisy-chained configuration 32 of FIG. 2, a signal encounters varying amounts of delay before reaching a destination DIMM or the memory controller 33. For example, the DIMM 44 may receive a signal transmitted from the memory controller 33 after a specific delay has elapsed, wherein the delay would include the time consumed by N−1 hops needed before the signal can reach DIMM 44. On the other hand, in case of DIMM 40, the signal may get delayed only by the time taken to conclude a single hop (through DIMM 34) to reach DIMM 40. In the event of a response generated by a DIMM, the delay for the response to reach the memory controller 33 also varies depending on the "depth" of the memory channel. For example, a response generated by DIMM0(34) may reach the memory controller without any "hops", whereas a response from the DIMM 44 may need to go through N−1 hops before reaching the memory controller 33. Thus, the amount of delay may linearly vary with the physical proximity of a memory module 34, 40, 44 to the memory controller 33 (i.e., the farther the memory module, the higher the delay), and may also linearly vary with the total number of memory modules in the memory channel (i.e., the more the number of memory modules serially connected to the controller 33 in the daisy-chained manner, the higher the delay for the farther modules).

It is seen from the above discussion that in the daisy-chained configuration 32 of FIG. 2, a command from the memory controller 33 may be processed by different DIMMs at different times because of the inherent command propagation delay through "hops." Similarly, responses from different DIMMs may arrive at different times at the controller 33, again because of the delays through "hops." In the embodiment of FIG. 2, the command delay or command propagation delay (i.e., the total delay for a command or signal from the memory controller 33 to reach the farthest DIMM 44) must be accounted for along with the response delay or response propagation delay (i.e., the total delay for a response from the farthest DIMM 44 to reach the memory controller 33) so as to assure that a response from any DIMM in the system 32 reaches the memory controller 33 at the same time. This effect may be called "delay levelization", i.e., the memory controller 33 need not wait for varying amounts of time to receive responses from various DIMMs in the system 32. Instead, a fixed, predetermined time delay is all that is required for the memory controller 33 to wait for in expecting a reply from any DIMM in the system 32. Thus, from the memory controller's perspective, only a fixed, single delay exists between sending a command and receive a response, irrespective of the depth of the memory channel or the physical proximity of a DIMM to the memory controller 33. This aspect is similar in principle to the latency in the parallel bus configuration of FIG. 1. As noted before, in case of FIG. 1, the delay of the slowest DIMM may govern the latency experienced by the controller 11 between a command and the receipt of its response from a DIMM in the system 10. In case of the daisy-chained configuration 32 of FIG. 2, it is similarly desirable that the controller 33 be freed from making latency determinations on a case-by-case basis for each DIMM. Instead, the delay may be "levelized" so that the controller 33 may receive (or "expect") a response from any DIMM 34, 40, 44 at the same time.

FIG. 3 illustrates a prior art methodology to achieve delay levelization in the daisy-chained memory channel of FIG. 2. In FIG. 3, constructional details to achieve delay levelization are illustrated for only one of the DIMMs (i.e., DIMM1(40)) in the system 32 in FIG. 2. However, it is evident that a similar configuration may be present on each DIMM 34, 40, 44 in the system 32. The DIMM 40 in FIG. 3 is shown to include a DIMM-specific response delay unit 52, which allows a programmable delay to be stored therein. The amount of delay to be programmed in the delay unit 52 may primarily depend on three factors: (1) the physical proximity of the DIMM 40 to the memory controller 33, (2) the total number of DIMMs in the daisy-chained configuration 32, and (3) the total of the command propagation delay to the farthest DIMM in the system (e.g., the DIMM 44 in FIG. 2) and the response propagation delay from the farthest DIMM to the memory controller 33. For example, for simplicity and illustration, assume that there are only three DIMMs (DIMMs 34, 40, and 44) in the system 32 of FIG. 2 and there is one clock cycle of "hop-related" delay for each of the command and response propagations at each DIMM in the system 32 (except the farthest DIMM 44, as discussed below). That is, it is assumed that it takes one clock cycle of delay to propagate a command signal to the next downstream DIMM over the downlink channel, and it also takes one clock cycle of delay to propagate a response signal to the next upstream DIMM over the uplink channel—i.e., a symmetrical delay in uplink and downlink channels. In that case, ignoring very small signal processing delays (to process a command and to generate a response) by the DRAM memory bank 42, the delay unit 52 in FIG. 3 may be programmed to appropriately delay transmission of the response (which may contain the data to be read) generated by the memory chips in the memory bank 42 to the command from the memory controller 33.

In the present example, the amount of delay to be programmed in the delay unit 52 equals [T*(N−1)/P] clock cycles, where "T" is the total "hop-related" clock cycle delay at a DIMM (except the farthest DIMM 44, as discussed below) including the delays to propagate a command to the next "downstream" DIMM and a response to the next "upstream" DIMM in the daisy chain (T=2 in the present example), 'N' is the total number of DIMMs in the system (here, N=3), and "P" is the physical proximity of the DIMM to the memory controller 33 (e.g., P=1 for the first or closest DIMM 34, P=2 for the second downstream DIMM 40, and so on). Therefore, in case of DIMM1(40), the value of delay to be programmed in the unit 52 is equal to 2 clock cycles, whereas the value of delay to be stored in the corresponding delay unit (not shown) in the DIMM0(34) is 4 clock cycles. In case of the farthest DIMM (i.e., the DIMM 44 in FIG. 2), the value of programmable delay may be zero because T=0 for the farthest DIMM.

It is seen from the foregoing that the levelization discussed with reference to FIGS. 2 and 3 allows the memory controller 33 to receive a response from any memory module in the daisy-chained configuration 32 at the same time. With the use of appropriate delays at each DIMM in the system 32 to compensate for the time consumed in propagation of command and response signals to/from the farthest DIMM in the daisy chain, the memory controller 33 receives a response from each DIMM at the same time, regardless of the physical proximity of the DIMM with respect to the controller 33. That is, the controller 33 "expects" and receives the response after a fixed delay has elapsed from the transmission of the command by the controller 33 over the downlink channel, regardless of whether the command is sent to a single DIMM or broadcast to all DIMMs in the system. For example, if a command is sent at time "t", then in the case of the previous example, the memory controller 33 receives a response 4 clock cycles after "t", regardless of whether the command is sent to DIMM0(34) or to DIMM N-1(44).

It is observed with reference to the embodiment of FIG. 3 that the dotted lines are shown in FIG. 3 to illustrate how a signal propagates within the DIMM 40. Thus, for example, a command signal appearing at DL_In terminal 48B would directly propagate to the DL_Out terminal 48C to be sent to the next downstream DIMM. That command signal would also be sent to the DRAM memory bank 42 for processing (e.g., data writing to memory cells). On the other hand, a response signal appearing at the UL_In terminal 50C from an adjacent ("upstream") DIMM would similarly be propagated directly to the UL_Out terminal 50B. The DIMM 40 may add its own response (appropriately delayed through the delay unit 52 as discussed hereinbefore) with the signal received at the UL_In terminal 50C so as to also send its response along with the previous DIMM's response to the next DIMM in the uplink channel.

Despite streamlining or "normalizing" the delivery of responses from DIMMs to the memory controller 33, the embodiment of FIG. 3 still leaves the memory controller 33 unable to predict when a command will be executed by a specific DIMM. It may be desirable, especially in some DRAM operations, for the memory controller 33 to predict the execution of the commands by addressee DIMMs so that the controller 33 can control the memory system power consumption (or power profile) with better certainty and/or more easily. For example, some DRAM operations, such as a "Refresh" command, may consume a lot of power. In the embodiment of FIG. 3, the memory controller 33 may spread out the DIMM-specific refresh commands over time to try to reduce drawing too much system power, i.e., to try to avoid sudden surges in power consumption when two or more DIMMs simultaneously execute their corresponding refresh commands. Thus, in the case of only three DIMMs (e.g., DIMMs 34, 40, 44), the memory controller 33 may send a refresh command to the farthest DIMM 44 on the first clock cycle, then a second refresh command to the middle DIMM 40 on the second clock cycle, and a third refresh command to the closest DIMM 34 on the third clock cycle. However, despite such spreading out of refresh commands, it may happen that DIMMs 40 and 44 end up executing the refresh command at the same time, which may not be preferable. Or, even if such simultaneous processing of the refresh command is tolerated, it may still be desirable for the memory controller to "know" when the commands will be processed by recipient DIMMs.

Therefore, it is desirable to devise a system wherein, in addition to the prediction of the timing of receipt of a response from a DIMM, the memory controller can effectively predict when a command sent by it will be executed by the addressee DIMM. With such ability to predict command execution timing, the memory controller can efficiently control power profile of all the DRAM devices (or memory modules) on a daisy-chained memory channel.

SUMMARY

In one embodiment, the present disclosure contemplates a method that comprises: linking a plurality of memory modules in a daisy-chained configuration, wherein each of the plurality of memory modules contains a corresponding plurality of memory elements; receiving a command at one of the plurality of memory modules; propagating the command to one or more memory modules in the daisy-chained configuration; and configuring at least one of the plurality of memory modules to delay transmission of the command received thereat to one or more memory elements contained therein until a respective predetermined delay has elapsed.

In another embodiment, the present disclosure contemplates a method that comprises: linking a plurality of electronic devices in a daisy-chained configuration; receiving a command at an electronic device in the plurality of electronic devices; propagating the command to the remaining electronic devices in the daisy-chained configuration; and configuring each electronic device in the plurality of electronic devices to delay executing the command to generate a corresponding response thereto until a respective predetermined delay has elapsed.

In an alternative embodiment, the present disclosure contemplates a combination including a memory controller connected to a plurality of memory modules in a serial configuration, wherein at least one of the plurality of memory modules is configured to delay transmission of the command received thereat to one or more memory elements contained therein until a respective predetermined delay has elapsed. In a further embodiment, the present disclosure contemplates a system that includes a processor; a bus; a controller connected to the processor via the bus and also connected to a plurality of electronic devices in a daisy-chained configuration; and a plurality of electronic devices wherein each electronic device is configured to delay executing the command received from the controller to generate a corresponding response thereto until a respective predetermined delay has elapsed.

The present disclosure describes a methodology for a daisy-chained memory topology wherein, in addition to the prediction of the timing of receipt of a response from a memory module (DIMM), the memory controller can effectively predict when a command sent by it will be executed by the addressee DIMM. By programming DIMM-specific command delay in the DIMM's command delay unit, the command delay balancing methodology according to the present disclosure "normalizes" or "synchronizes" the execution of the command signal across all DIMMs in the memory channel. With such ability to predict command execution timing, the memory controller can efficiently control power profile of all the DRAM devices (or memory modules) on a daisy-chained memory channel. A separate DIMM-specific response delay unit in the DIMM may also be programmed to provide DIMM-specific delay compensation in the response path, further allowing the memory controller to accurately ascertain the timing of receipt of a response thereat to an earlier command sent thereby, and, hence, to better manage or plan (time-wise) further processing of the response.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying figures. It is to be understood that the figures and descriptions of the present disclosure included herein illustrate and describe elements that are of particular relevance to the present disclosure, while eliminating, for the sake of clarity, other elements found in typical data storage or memory systems. It is noted at the outset that the terms "connected", "connecting," "electrically connected," etc., are used interchangeably herein to generally refer to the condition of being electrically connected.

Figure 3:
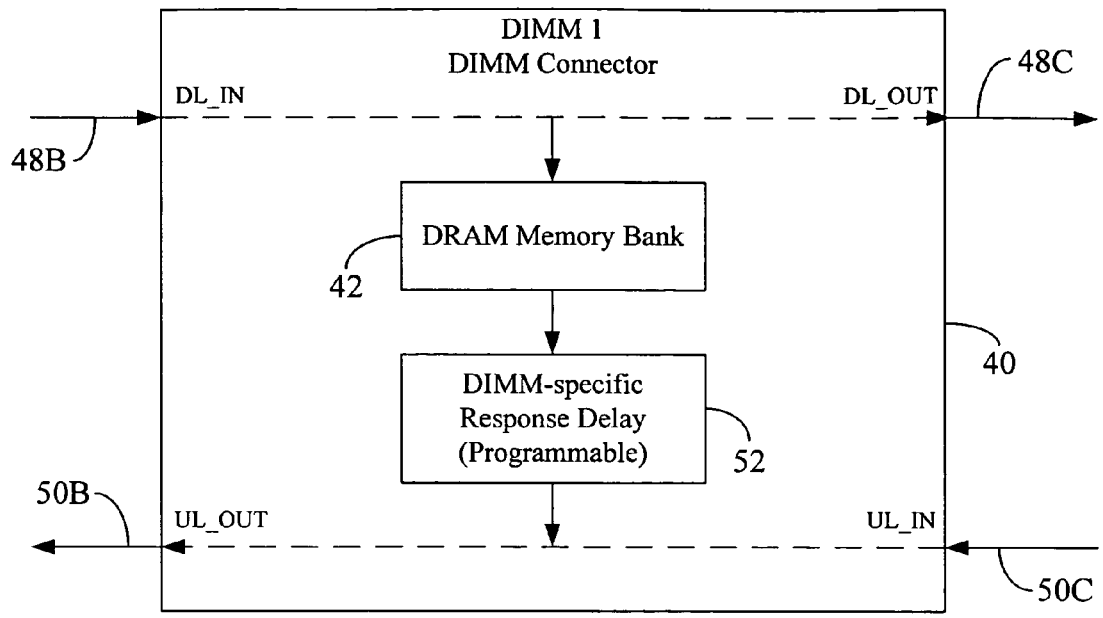
FIG. 3 illustrates a prior art methodology to achieve delay levelization in the daisy-chained memory channel of FIG. 2.
Figure 4:
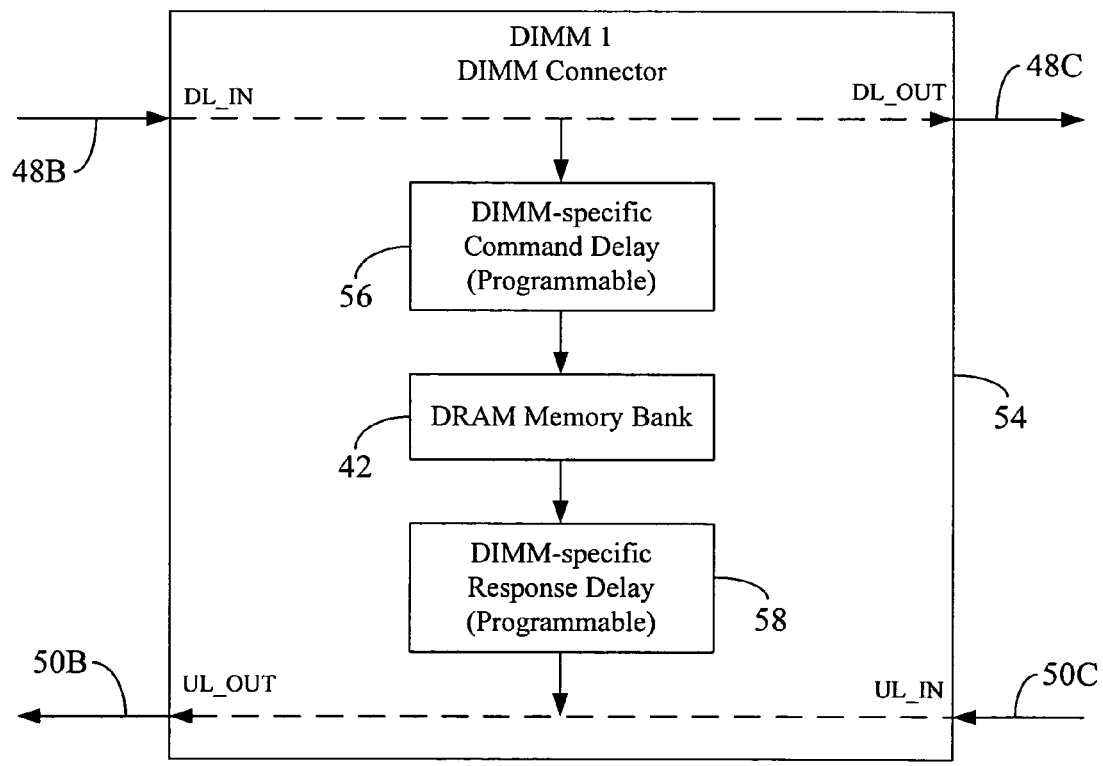
FIG. 4 depicts a command delay balancing methodology according to one embodiment of the present disclosure.

FIG. 4 depicts a command delay balancing methodology according to one embodiment of the present disclosure. For ease of illustration, only one memory module (DIMM) 54 with a DIMM-specific programmable command delay unit 56 is illustrated. The DIMM 54 may be a modified version of the DIMM 40 in FIG. 3 and, hence, it is also designated as DIMM1. The uplink and downlink terminals on the DIMM connector 54 are designated with the same reference numerals as those used in FIGS. 2 and 3. The DRAM memory bank 42 is also designated with the same reference numeral as that used in FIGS. 2 and 3. It is noted here that DIMM1(54) in FIG. 4 may be used in a daisy-chained configuration similar to that illustrated in FIG. 2. In that event, all DIMMs 34, 40, 44 shown in FIG. 2 may be replaced with corresponding DIMMs having construction similar to that depicted for the DIMM 54 in FIG. 4 to implement the command delay balancing methodology according to the present disclosure in the daisy-chained configuration topology of FIG. 2. Because of the different manner in which the command delay and response delay values are computed in the embodiment of FIG. 4, a programmable response delay unit 58 is shown in FIG. 4 with a reference numeral that is different from the reference numeral "52" used for the delay unit in FIG. 3. Thus, reference numerals that are common between FIGS. 3 and 4 identify similar circuit elements or components, whereas difference reference numerals are used to distinguish the modified or additional circuit elements or components present in the embodiment of FIG. 4.

Figure 1:
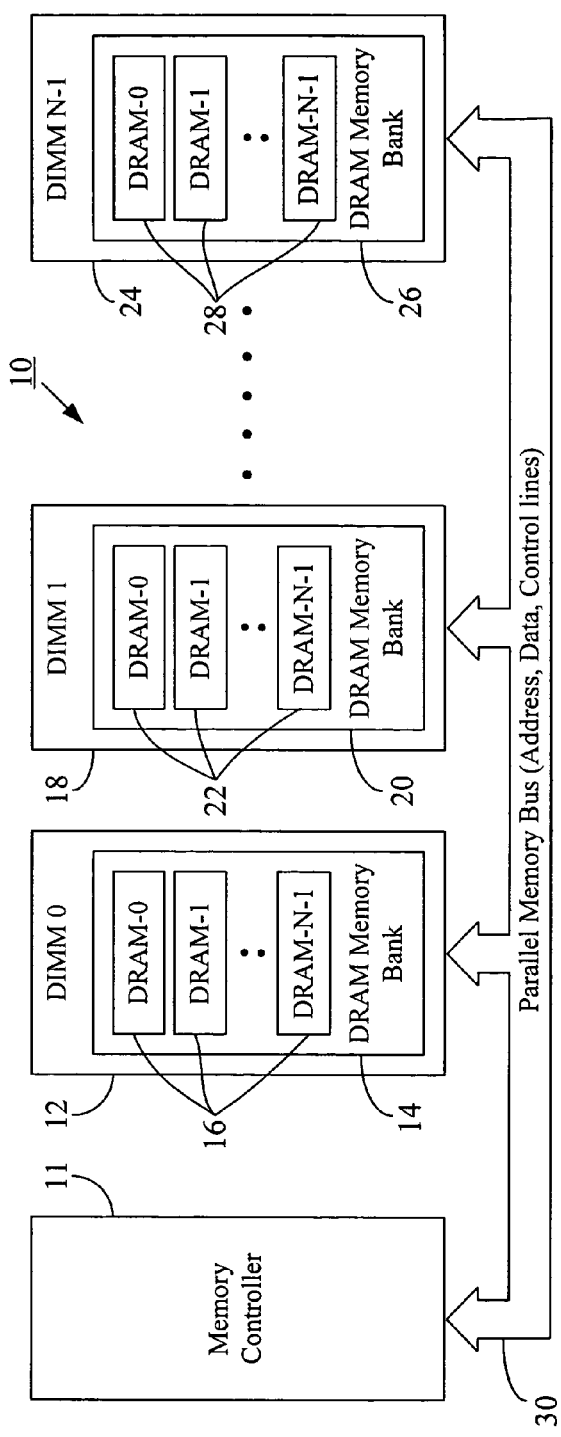
FIG. 1 illustrates a prior art arrangement showing signal communication between a memory controller and a plurality of memory devices (DIMMs) over a parallel memory bus.
Figure 2:
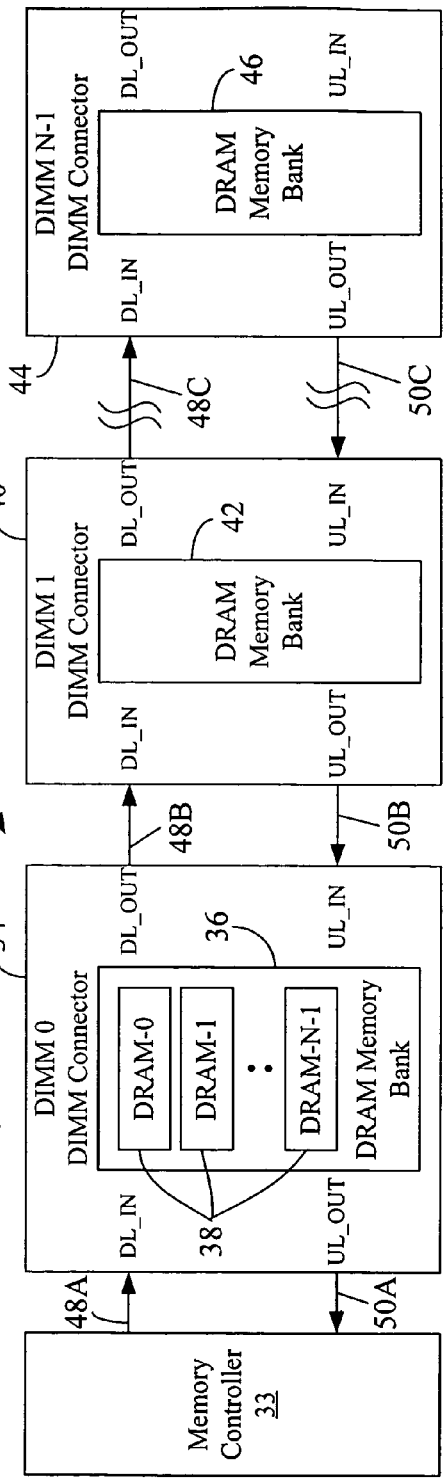
FIG. 2 illustrates an alternative configuration where memory modules (DIMMs) are connected to a memory controller in a daisy-chained configuration.

It is observed here that the sum total of command propagation delay and response propagation delay in the embodiment of FIG. 2 remains the same whether the configuration of each DIMM in FIG. 2 is that shown in FIG. 3 or the one shown in FIG. 4. A difference between the embodiments in FIGS. 3 and 4 is that the total signal propagation delay (i.e., the total of the command and response propagation delays) is accounted for through a single response path delay compensation in the embodiment of FIG. 3, whereas in the embodiment of FIG. 4, the total delay is divided into its corresponding command propagation delay and response propagation delay and each such delay component is compensated for individually as discussed hereinbelow.

As noted above, in the embodiment of FIG. 4, the one-way command propagation delay to propagate a command from the memory controller (e.g., the memory controller 33) to the farthest DIMM in the daisy chain (e.g., DIMM 44 suitably modified to include the circuit elements shown in FIG. 4) over the downlink channel is considered separately from the one-way response propagation delay to propagate a response from the farthest DIMM in the system to the memory controller. Thus, assuming, as before, a three DIMM daisy chain configuration (e.g., the configuration 32 shown in FIG. 2 with each DIMM having a topology similar to that shown for the DIMM 54 in FIG. 4) having one clock cycle of "hop-related" delay for each of the command and response propagations at each DIMM in the system 32 (except the farthest DIMM) and ignoring very small signal processing delays (to process a command and to generate a response) by the DRAM memory bank in the respective DIMM, the "hop-related" command propagation delay equals two clock cycles whereas the response propagation delay equals two cycles. In that event, in the embodiment of FIG. 4, the value of DIMM-specific command delay to be programmed in the DIMM's command delay unit (e.g., the unit 56) may be equal to $[C*(N-1)/P]$, where "C" is the total "hop-related" clock cycle delay at a DIMM to propagate a command to the next "downstream" DIMM, and the parameters "N" and "P" are the same as defined before. Similarly, in the embodiment of FIG. 4, the value of DIMM-specific response delay to be programmed in the DIMM's response delay unit (e.g., the unit 58) may be equal to $[R*(N-1)/P]$, where "R" is the total "hop-related" clock cycle delay at a DIMM to propagate a response to the next "upstream" DIMM, and the parameters "N" and "P" are the same as defined before. In one embodiment, $C+R=T$, where parameter "T" is as defined before.

Using the above formulas, it is seen that in case of a three-DIMM daisy chain (N=3), the command propagation delay=$C*(N-1)$=2 clock cycles, where C=1 clock cycle. Also, in such a configuration, the response propagation delay=$R*(N-1)$=2 clock cycles, where R=1 clock cycle. With these values, it is seen that the middle DIMM (e.g., the DIMM 54) in the three-DIMM daisy chain will have 1 clock cycle of DIMM-specific command delay programmed into the delay unit 56 because $[C*(N-1)/P]=1$. The middle DIMM 54 will also have 1 clock cycle of DIMM-specific response delay programmed into the delay unit 58 because $[R*(N-1)/P]=1$. On the other hand, the DIMM closest to the memory controller (e.g., DIMM 34 in FIG. 2 modified in the manner illustrated in FIG. 4) will have a 2 clock cycles of DIM-specific command delay programmed into its command delay unit (similar to the delay unit 56) and 2 clock cycles of response delay programmed into its response delay unit (similar to the delay unit 58). As before, the DIMM farthest from the memory controller (e.g., DIMM 44 in FIG. 2 modified in the manner illustrated in FIG. 4) would have zero clock cycle of delay in both of its command and response delay units because C=0 and R=0 for the farthest DIMM.

Except for a different delay value stored therein, the functionality of the response delay unit (e.g., the unit 58), as seen from outside the modules, appears the same as discussed hereinbefore with reference to the delay unit 52 in FIG. 3. However, the command delay unit (e.g., the delay unit 56 in FIG. 4) according to the present disclosure functions to delay execution or processing of a command by the addressee DIMM (e.g., DIMM 54) until the delay programmed in the DIMM's command delay unit 56 has elapsed. It is noted here that the terms "execution" or "processing" are used herein to refer to execution or processing of the command by the DIMM's DRAM memory bank (e.g., the memory bank 42). In one embodiment, these terms may also include the generation of the corresponding response (which is then appropriately delayed by the response delay unit 58). Thus, according to one embodiment of the present disclosure, a command signal received at the DL_In terminal 48B of the DIMM connector 54 is not only transferred (via the DL_Out terminal 48C) to the next DIMM in the downlink channel, but is also delayed by the command delay unit 56 before presenting or transmitting the command to the DRAM memory bank 42 and associated circuitry (not shown) for processing/execution. After the delay programmed in the unit 56 is elapsed, the DRAM memory bank 42 and its associated signal processing circuitry (not shown) may determine whether the command is addressed to the DIMM 54 for execution and, if so, then execute the command as instructed by the memory controller (e.g., write data into memory cells, perform a test operation on the memory cells, etc.) and generate a response which is then fed to the response delay unit 58 to be delayed by appropriate delay amount (as discussed hereinbefore) prior to releasing the response on the uplink channel (and eventually to the memory controller) via the UL-Out terminal 50B.

It is seen from the foregoing discussion that by programming DIMM-specific command delay in the DIMM's command delay unit (e.g., unit 56 in FIG. 4), the command delay balancing methodology according to the present disclosure "normalizes" or "synchronizes" the execution of the command signal across all DIMMs in the memory channel. Further, a memory controller (e.g., the controller 33 in FIG. 2) in the daisy-chained system may be adapted or configured to store therein the value of the command propagation delay (i.e., the total delay for a command signal from the controller to reach the farthest DIMM in the system) so as to "predict" when a given command will be executed by the addressee DIMM(s). For example, in the case of exemplary clock delay values discussed hereinbefore, it is seen that the command propagation delay is 2 clock cycles (two "hops" to reach the farthest DIMM in the 3 DIMM channel). Therefore, the memory controller in such a system may expect each addressee DIMM to execute the command two clock cycles after the time "t" when the controller sends the command to the DIMM closest to it. Thus, even if the command signal is not a broadcast signal, but instead addressed to a specific DIMM (or a select set of DIMMs) in the memory channel, the predetermined delay programmed into the DIMM's corresponding command delay unit "normalizes" the command execution, allowing the memory controller to effectively "predict" when the command will be executed by the addressee DIMM(s).

The delay normalization methodology according to the present disclosure achieves delay compensation not only in the response path (which comprises the response signal propagation path over all uplinks in the system), but also in the command path (which comprises the command signal propagation path over respective downlinks in the system). Because of the delay compensation in the command path, a memory controller in the daisy-chained topology may be configured to predict when a command signal will be executed or processed by a DIMM or DIMMs to which it is addressed for execution. This capability allows the memory controller to efficiently time the transmission of resource-intensive command signals (e.g., a Refresh command signal requiring substantial power consumption by the memory module) to one or more DIMMs in the system so as to effectively balance power consumption or power profile of the system (to prevent, for example, system overload or sudden power surges in the system). The controlled management of memory channel power profile further results in improved integrity of signals traversing the uplink and downlink channels in the daisy-chained configuration. Furthermore, the delay compensation in the response path results in delay "levelization", further allowing the memory controller to accurately ascertain the timing of receipt of a response to an earlier command sent thereby, and, hence, to better manage or plan (time-wise) further processing of the response.

Figure 5:
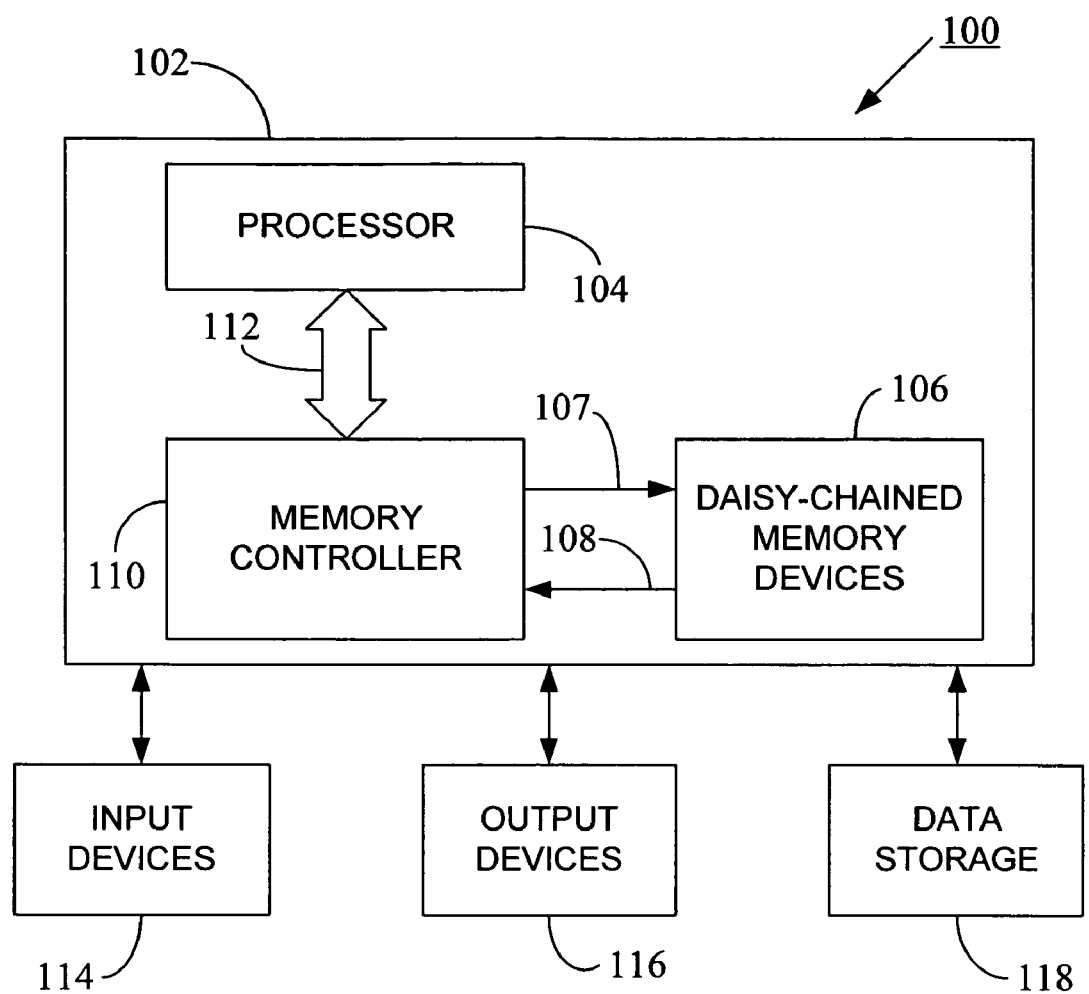
FIG. 5 is a block diagram depicting a system in which command delay balancing methodology according to the teachings of the present disclosure may be used.

FIG. 5 is a block diagram depicting a system 100 in which command delay balancing methodology according to the teachings of the present disclosure may be used. The system 100 may include a data processing unit or computing unit 102 that includes a processor 104 for performing various computing functions, such as executing specific software to perform specific calculations or data processing tasks. The computing unit 102 may also include a set of daisy-chained memory devices or memory modules 106 (similar in configuration to that shown in FIG. 2) that are in communication with the processor 104 through a memory controller 110. The memory controller 110 may be connected to one of the daisy-chained memory devices 106 via a downlink 107 and an uplink 108. Other memory devices may be connected to this memory device (not shown) that is directly connected to the memory controller 110 via respective uplinks and downlinks in the manner similar to the one illustrated, for example, in the configuration 32 of FIG. 2. For ease of discussion, the downlink 107 and the uplink 108 are jointly referred to herein as a "memory controller bus." The memory controller bus may carry address, data, and/or control signals as discussed hereinbefore. Each of the memory devices 106 may have the configuration illustrated for the exemplary DIMM 54 in FIG. 4. That is, each memory device 106 may include device-specific programmable command and response delay units to provide command path and response path delay compensation as discussed hereinbefore. Further, each of the memory device 106 can be a memory module (DIMM) containing a plurality of dynamic random access memory (DRAM) chips or another type of memory circuits such as SRAM (Static Random Access Memory) chip or Flash memory. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus® DRAMs. Those of ordinary skill in the art will readily recognize that the memory device 106 of FIG. 5 is simplified to illustrate one embodiment of a memory device and is not intended to be a detailed illustration of all of the features of a typical memory module or DIMM. The processor 104 can perform a plurality of functions based on information and data stored in the memory devices 106. The processor 104 can be a microprocessor, digital signal processor, embedded processor, micro-controller, dedicated memory test chip, or the like.

The memory controller 110 controls data communication to and from the memory devices 106 in response to control signals (not shown) received from the processor 104 over the bus 112, which may be a parallel or a serial bus. The memory controller 110 may include a command decode circuit (not shown). The command decode circuit may receive the input control signals (not shown) on the bus 112 to determine the modes of operation of one or more of the memory devices 106. Some examples of the input signals or control signals (not shown in FIG. 5) on the bus 112 (and also on the memory controller bus 108) include an external clock signal, a Chip Select signal, a Row Access Strobe signal, a Column Access Strobe signal, a Write Enable signal, a memory Refresh signal, etc.

The system 100 may include one or more input devices 114 (e.g., a keyboard, a mouse, etc.) connected to the computing unit 102 to allow a user to manually input data, instructions, etc., to operate the computing unit 102. One or more output devices 116 connected to the computing unit 102 may also be provided as part of the system 100 to display or otherwise output data generated by the processor 104. Examples of output devices 116 include printers, video terminals or video display units (VDUs). In one embodiment, the system 100 also includes one or more data storage devices 118 connected to the data processing unit 102 to allow the processor 104 to store data in or retrieve data from internal or external storage media (not shown). Examples of typical data storage devices 118 include drives that accept hard and floppy disks, CD-ROMs (compact disk read-only memories), and tape cassettes.

It is noted here that the separate command and response delay compensation methodology according to one embodiment of the present disclosure may be used not only with daisy-chained memory modules, but also with any other daisy-chained electronic devices (not shown) connected in a manner similar to that illustrated in FIG. 2 and controlled by a common controller (not shown) that may need to predict timing of command execution at one or more of the electronic devices as well as the timing of delivery of responses from one or more of the electronic devices.

The foregoing describes a methodology for a daisy-chained memory topology wherein, in addition to the prediction of the timing of receipt of a response from a memory module (DIMM), the memory controller can effectively predict when a command sent by it will be executed by the addressee DIMM. By programming DIMM-specific command delay in the DIMM's command delay unit, the command delay balancing methodology according to the present disclosure "normalizes" or "synchronizes" the execution of the command signal across all DIMMs in the memory channel. With such ability to predict command execution timing, the memory controller can efficiently control power profile of all the DRAM devices (or memory modules) on a daisy-chained memory channel. A separate DIMM-specific response delay unit in the DIMM may also be programmed to provide DIMM-specific delay compensation in the response path, further allowing the memory controller to accurately ascertain the timing of receipt of a response thereat to an earlier command sent thereby, and, hence, to better manage or plan (time-wise) further processing of the response.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a plurality of memory modules linked in a daisy-chained configuration, wherein each of said plurality of memory modules contains a corresponding plurality of memory elements, said method comprising:

propagating a command across the plurality of memory modules in the daisy-chained configuration;

receiving said command at each of said plurality of memory modules in said daisy-chained configuration; and delaying the start of execution of said command at one or more memory modules by one or more memory elements contained therein until a respective first predetermined delay has elapsed to normalize the execution of said command across said plurality of memory modules in said daisy-chained configuration, wherein said first predetermined delay for a memory module is calculated based upon a hop related command propagation delay, a position of said memory module in said daisy-chained configuration, and a total number of memory modules in said daisy-chained configuration.

2. The method of claim 1, further comprising:
generating a response to said command received at said memory module; and
delaying transmission of said response until a respective second predetermined delay has elapsed.

3. The method of claim 1, wherein said predetermined delay for a memory module is calculated according to:

Delay=C*(N−1)/P, where C is the hop related command propagation delay representing a delay at a memory module to propagate a command to a next downstream memory module, N is the total number of memory modules in said daisy-chained configuration, and P is the position of the memory module in said daisy-chained configuration.

4. A method of configuring a plurality of memory modules linked in a daisy-chained configuration, wherein each of said plurality of memory modules contains a corresponding plurality of memory elements, and wherein a memory controller is connected to only one of said plurality of memory modules, said method comprising:
determining a physical position of at least one of said plurality of memory modules in said daisy-chained configuration;
determining a hop related command propagation delay time to propagate a command from said memory controller to a next one of said plurality of memory modules in said daisy-chained configuration;
determining a respective first predetermined delay based on said physical position, said hop-related command propagation delay time, and the total number of memory modules in said plurality of memory modules; and
programming said at least one of said plurality of memory modules so as to impart said respective first predetermined delay to a received command to normalize the execution of said received command prior to transmitting said received command to said one or more memory elements contained therein.

5. The method of claim 4, further comprising:
determining a response delay time required to propagate a last response to said memory controller, wherein said last response is a response to said command generated by one of said plurality of memory modules that last receives said command in said daisy-chained configuration;
determining a respective second predetermined delay based on said physical proximity, said response delay time, and the total number of memory modules in said plurality of memory modules; and
programming said at least one of said plurality of memory modules so as to impart said respective second predetermined delay to a produced response prior to transmitting said produced response to said memory controller.

6. The method of claim 4, wherein said first predetermined delay for a memory module is calculated according to:

Delay=C*(N−1)/P, where C is the hop related command propagation delay representing a delay at a memory module to propagate a command to a next downstream memory module, N is the total number of memory modules in said daisy-chained configuration, and P is the position of the memory module in said daisy-chained configuration.

7. A method of operating a plurality of electronic devices linked in a daisy-chained configuration having a controller connected to only one of said plurality of electronic devices, said method comprising:
transmitting a command from said controller;
receiving said command at a first electronic device in said plurality of electronic devices;
propagating said command to the remaining electronic devices in said daisy-chained configuration; and
delaying the start of executing said command to generate a corresponding response thereto until a respective first predetermined delay has elapsed to normalize the execution of said command across said plurality of electronic devices in said daisy-chained configuration, wherein said first predetermined delay for an electronic device is calculated based upon a hop related command propagation delay, a position of said electronic device in said daisy-chained configuration, and a total number of electronic devices in said daisy-chained configuration.

8. The method of claim 7, wherein said respective first predetermined delay is zero for the electronic device that last receives said propagated command.

9. The method of claim 7, further comprising:
delaying transmission of said corresponding response to said controller until a respective second predetermined delay has elapsed.

10. The method of claim 9, wherein said respective second predetermined delay is zero for the electronic device that last receives said propagated command.

11. The method of claim 7, wherein said first predetermined delay for an electronic device is calculated according to:

Delay=C*(N−1)/P, where C is the hop related command propagation delay representing a delay at an electronic device to propagate a command to a next downstream electronic device, N is the total number of electronic devices in said daisy-chained configuration, and P is the position of the electronic device in said daisy-chained configuration.

12. A method of configuring a plurality of electronic devices linked in a daisy-chained configuration having a controller connected to only one of said plurality of electronic devices, said method comprising:
determining a physical position of each of said plurality of electronic devices in said daisy-chained configuration;
determining a hop-related command propagation delay time to propagate a command from said controller to a next one of said plurality of electronic devices in said daisy-chained configuration;
determining a respective first predetermined delay for each of said plurality of electronic devices based on said physical position thereof, said hop-related command propagation delay time, and the total number of electronic devices in said plurality of electronic devices; and
programming each of said plurality of electronic devices so as to delay the start of processing of a received command until said respective first predetermined delay has elapsed to normalize the execution of said received command across said plurality of electronic devices in said daisy-chained configuration.

13. The method of claim 12, further comprising:
determining a response delay time required to propagate a response to said controller from the electronic device that last receives said command in said daisy-chained configuration;
determining a respective second predetermined delay for each of said plurality of electronic devices based on said physical proximity thereof, said response delay time, and the total number of electronic devices in said plurality of electronic devices; and programming each of said plurality electronic devices so as to impart said respective second predetermined delay to a produced response prior to transmitting said produced response to said controller.

14. The method of claim 12, wherein said predetermined delay for an electronic device is calculated according to:

Delay=C*(N−1)/P, where C is the hop related command propagation delay representing a delay at an electronic device to propagate a command to a next downstream electronic device, N is the total number of electronic devices in said daisy-chained configuration, and P is the position of the electronic device in said daisy-chained configuration.

15. A combination, comprising:
a memory controller configured to generate and transmit a command; and
a plurality of memory modules connected to one another in a serial configuration, wherein only one of said plurality of memory modules is connected to said memory controller and wherein each memory module contains a corresponding plurality of memory elements,
wherein the memory module connected to said memory controller is configured to receive said command from said memory controller and to propagate said command to other memory modules in said serial configuration, wherein at least one of said plurality of memory modules is configured to delay the start of execution of a received command by one or more memory elements contained therein until a respective first predetermined delay has elapsed to normalize the execution of said received command across said plurality of memory modules in said serial configuration, and wherein said first predetermined delay for a memory module is calculated based upon a hop related command propagation delay, a position of said memory module in said daisy-chained configuration, and a total number of memory modules in said daisy-chained configuration.

16. The combination of claim 15, wherein said respective first predetermined delay is stored in said at least one of said plurality of memory modules.

17. The combination of claim 15, wherein said respective first predetermined delay is zero for the memory module that last receives said propagated command in said serial configuration.

18. The combination of claim 15, wherein said at least one of said plurality of memory modules is configured to generate a response to said received command and to delay transmission of said response to said memory controller until a respective second predetermined delay has elapsed.

19. The combination of claim 18, wherein said respective second predetermined delay is determined based on the physical proximity of said at least one of said plurality of memory modules to said memory controller, a response delay time required to propagate to said memory controller a corresponding response to said command from one of said plurality of memory modules that last receives said command in said serial configuration, and the total number of memory modules in said plurality of memory modules.

20. The combination of claim 18, wherein said respective second predetermined delay is stored in said at least one of said plurality of memory modules.

21. The combination of claim 18, wherein said respective second predetermined delay is zero for the memory module that last receives said propagated command in said serial configuration.

22. The combination of claim 14, wherein said serial configuration is a daisy-chained configuration.

23. The combination of claim 15, wherein said first predetermined delay for a memory module is calculated according to:

Delay=C*(N−1)/P, where C is the hop related command propagation delay representing a delay at a memory module to propagate a command to a next downstream memory module, N is the total number of memory modules in said daisy-chained configuration, and P is the position of the memory module in said daisy-chained configuration.

24. A system, comprising:
a processor;
a bus;
a controller connected to said processor via said bus, wherein said controller is configured to generate and transmit a command; and
a plurality of electronic devices connected to one another in a daisy-chained configuration, wherein only one of said plurality of electronic devices is connected to said controller and wherein each of said plurality of electronic devices communicates to said controller using a signal transfer mechanism for said daisy-chained configuration,
wherein the electronic device connected to said controller is configured to receive said command from said controller and to propagate said command to other electronic devices in said daisy-chained configuration, wherein at least one electronic device in said plurality of electronic devices is configured to delay the start of executing a received until a respective first predetermined delay has elapsed to normalize the execution of said received command across said plurality of electronic devices in said daisy-chained configuration, and wherein said first predetermined delay for an electronic device is calculated based upon a hop related command propagation delay, a position of said electronic device in said daisy-chained configuration, and a total number of electronic devices in said daisy-chained configuration.

25. The system of claim 24, wherein said respective first predetermined delay is stored in each said electronic device.

26. The system of claim 23, wherein said respective first predetermined delay is zero for the electronic device that last receives said propagated command.

27. The system of claim 23, wherein each said electronic device is further configured to delay transmission of a response to said received command to said controller until a respective second predetermined delay has elapsed, wherein said respective second predetermined delay is determined based on the physical proximity of each said electronic device to said controller, a response delay time required to propagate a produced response to said command to said controller from the electronic device that last receives said command in said daisy-chained configuration, and the total number of electronic devices in said plurality of electronic devices.

28. The system of claim 27, wherein said respective second predetermined delay is stored in each said electronic device.

29. The system of claim 27, wherein said respective second predetermined delay is zero for the electronic device that last receives said propagated command.

30. The system of claim 24, wherein said predetermined delay for an electronic device is calculated according to:

Delay=C*(N−1)/P, where C is the hop related command propagation delay representing a delay at an electronic device to propagate a command to a next downstream electronic device, N is the total number of electronic devices in said daisy-chained configuration, and P is the position of the electronic device in said daisy-chained configuration.

* * * * *

UNITED STATES PATENT AND TRADEMARK OFFICE
CERTIFICATE OF CORRECTION

| | | |
|---|---|---|
| PATENT NO. | : 7,669,027 B2 | Page 1 of 1 |
| APPLICATION NO. | : 10/922299 | |
| DATED | : February 23, 2010 | |
| INVENTOR(S) | : Douglas Alan Larson | |

It is certified that error appears in the above-identified patent and that said Letters Patent is hereby corrected as shown below:

In column 16, line 1, in Claim 22, delete "claim 14," and insert -- claim 15, --, therefor.

In column 16, line 45, in Claim 26, delete "claim 23," and insert -- claim 24, --, therefor.

In column 16, line 48, in Claim 27, delete "claim 23," and insert -- claim 24, --, therefor.

Signed and Sealed this

Eighteenth Day of May, 2010

David J. Kappos
*Director of the United States Patent and Trademark Office*